(12) United States Patent
Vest

(10) Patent No.: US 8,735,049 B2
(45) Date of Patent: May 27, 2014

(54) LIQUID PLATEMAKING PROCESS

(76) Inventor: Ryan W. Vest, Cumming, GA (US)

( * ) Notice: Subject to any disclaimer, the term of this patent is extended or adjusted under 35 U.S.C. 154(b) by 0 days.

(21) Appl. No.: 13/477,556

(22) Filed: May 22, 2012

(65) Prior Publication Data

US 2013/0316290 A1 Nov. 28, 2013

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC ........... 430/306; 430/309; 430/325; 430/326; 430/327; 430/328; 430/330; 101/453; 101/463.1

(58) Field of Classification Search
USPC ........................................ 430/306
See application file for complete search history.

(56) References Cited

U.S. PATENT DOCUMENTS

| 3,537,853 | A | 11/1970 | Wessells et al. |
| 3,597,080 | A | 8/1971 | Gush |
| 3,794,494 | A | 2/1974 | Kai et al. |
| 3,960,572 | A | 6/1976 | Ibata et al. |
| 4,193,798 | A | 3/1980 | Sano et al. |
| 4,442,302 | A | 4/1984 | Pohl |
| 4,582,422 | A | 4/1986 | Stroud |
| 4,720,448 | A | 1/1988 | Mousseau |
| 5,213,949 | A | 5/1993 | Kojima et al. |
| 5,813,342 | A | 9/1998 | Strong |
| 8,114,566 | B2 * | 2/2012 | Araki et al. ................ 430/270.1 |
| 2004/0219458 | A1 * | 11/2004 | Holt et al. ................. 430/281.1 |
| 2006/0063109 | A1 * | 3/2006 | Choi et al. .................... 430/300 |
| 2008/0107908 | A1 | 5/2008 | Long et al. |
| 2011/0300398 | A1 * | 12/2011 | Vest et al. ..................... 428/600 |
| 2012/0082932 | A1 * | 4/2012 | Battisti et al. ............. 430/270.1 |

FOREIGN PATENT DOCUMENTS

GB   1251751   10/1971

* cited by examiner

*Primary Examiner* — Chanceity Robinson
(74) *Attorney, Agent, or Firm* — Carmody Torrance Sandak & Hennessey LLP

(57) ABSTRACT

A method of making a relief printing element in a liquid photopolymer platemaking process is described. The method comprises the steps of: (a) selectively exposing the liquid photopolymer to actinic radiation through a negative to crosslink and cure portions of the liquid photopolymer; and (b) reclaiming uncured portions of the liquid photopolymer to be reused in the platemaking process. The step of reclaiming uncured portions of the liquid photopolymer comprises (i) heating the printing element to decrease the viscosity of the uncured liquid photopolymer; and (ii) removing uncured liquid photopolymer from the surface of the relief image printing element so that recovery of uncured liquid photopolymer from the surface of the relief image printing element is enhanced.

13 Claims, No Drawings

LIQUID PLATEMAKING PROCESS

FIELD OF THE INVENTION

The present invention relates generally to methods of producing relief image printing elements from liquid photopolymerizable resins.

BACKGROUND OF THE INVENTION

Flexographic printing is widely used in the production of newspapers and in the decorative printing of packaging media. Numerous photosensitive printing plate formulations have been developed to meet the demand for fast, inexpensive processing and long press runs.

Photosensitive printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. The slip film release layer may be disposed between the protective cover sheet and the photocurable layer(s) to protect the plate from contamination, increase ease of handling, and act as an ink-accepting layer. After exposure and development, the photopolymer flexographic printing plate consists of various image elements supported by a floor layer and anchored to a backing substrate.

Flexographic printing plates desirably work under a wide range of conditions. For example, they should be able to impart their relief image to a wide range of substrates, including cardboard, coated paper, newspaper, calendared paper, and polymeric films such as polypropylene. Importantly, the image should be transferred quickly and with fidelity, for as many prints as the printer desires to make.

Flexographic printing elements can be manufactured in various ways including with sheet polymers and by the processing of liquid photopolymer resins. Flexographic printing elements made from liquid photopolymer resins have the advantage that the uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings. The plates are typically formed by placing a layer of liquid photopolymerizable resin on a glass plate but separated from the glass plate by a substrate and/or a coverfilm. Actinic light, such as UV light, is directed against the resin layer through a negative. The result is that the liquid resin is selectively crosslinked and cured to form a printing image surface that mirrors the image on the negative. Upon exposure to actinic radiation, the liquid photopolymer resin polymerizes and changes from a liquid state to a solid state to form the raised relief image. After the process is complete, non-crosslinked liquid resin can be recovered (i.e., reclaimed) from the printing plates and recycled in the process to make additional plates.

Residual traces of liquid resin remaining in the regions of the resin that were protected from actinic radiation by the opaque regions of the transparency are then washed away using a developer solution. The cured regions of the printing element are insoluble in the developer solution, and so after development, a relief image formed of cured photopolymerizable resin is obtained. The cured resin is likewise insoluble in certain inks, and thus may be used in flexographic printing. The liquid photopolymerizable resin may also be exposed to actinic radiation from both sides of the resin layer, Various processes have been developed for producing printing plates from liquid photopolymer resins as described, for example, in U.S. Pat. No. 5,213,949 to Kojima et al., U.S. Pat. No. 5,813,342 to Strong et al., U.S. Pat. Pub. No. 2008/0107908 to Long et al., and in U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a photographic negative is placed on a glass platen and a coverfilm is placed on the negative in an exposure unit. All of the air is then removed by vacuum so that any wrinkling of the negative or coverfilm can be eliminated. Thereafter, a layer of liquid photopolymer and a backing sheet (i.e., a thin layer of polyester or polyethylene terephthalate) are applied on top of the coverfilm and negative. The backing sheet may be coated on one side to bond with the liquid photopolymer and to serve as the back of the plate after exposure. Then upper and/or lower sources of actinic radiation (i.e., UV lights) are used to expose the photopolymer to actinic radiation to crosslink and cure the liquid photopolymer layer in the areas not covered by the negative. The top sources of actinic radiation are used to create the floor layer of the printing plate (i.e., back exposure) while the bottom sources of actinic radiation are used to face expose the photopolymer to actinic radiation through the negative to create the relief image. Plate gauge may be set by positioning a top exposure glass at a desired distance from a bottom exposure glass after dispensing liquid photopolymer on the protected bottom exposure glass.

After the exposure is complete, the printing plate is removed from the exposure unit and the photopolymer that was not exposed to actinic radiation (i.e., the photopolymer covered by the negative) is reclaimed for further use. In liquid platemaking, resin recovery is an important factor relating to the production of photopolymerizable resin printing plates because the resins used to produce the plates are relatively expensive. In all areas not exposed to UV radiation, the resin remains liquid after exposure and can then be reclaimed. In a typical process, the uncured resin is physically removed from the plate in a process step so that the uncured resin can be reused in making additional plates. This "reclamation" step typically involves squeegeing, vacuuming or otherwise removing liquid photopolymer remaining on the surface of the printing plate. The coversheet may then be stripped from the plate. This reclamation step not only saves material costs of the photopolymer resin but also reduces the use and cost of developing chemistry and makes a lighter plate that is safer and easier to handle.

Any residual traces of liquid resin remaining after the reclamation step may then be removed by nozzle washing or brush washing using a wash-out solution to obtain a washed-out plate, leaving behind the cured relief image. Typically, the plate is placed into a washout unit wherein an aqueous solution comprising soap and/or detergent is used to wash away any residual unexposed photopolymer. The plate is then rinsed with water to remove any residual solution.

After the washout step has been completed, the printing plate is subjected to various post exposure and detackification steps. Post exposure may involve submerging the plate in a water and salt solution and performing an additional exposure of the printing plate to actinic radiation (UV light) to fully cure the printing plate and to increase plate strength. The printing plate may then be rinsed and dried by blowing hot air onto the plate, by using an infrared heater or by placing the printing plate into a post exposure oven.

If used, the detackification step may involve the use of a germicidal unit (light finisher) to ensure a totally tack-free plate surface. This step is not require for all plates, as certain resins may be tack-free and thus printing press ready without the need for the detackification step.

As discussed above, because of the material costs of the liquid photopolymers, it is desirable to reclaim as much of the liquid photopolymer as possible in the reclamation step. Therefore, it would be desirable to optimize the amount of liquid photopolymer that may be reclaimed.

The present invention relates to improvements to the reclamation step of the liquid platemaking process to more efficiently and accurately produce relief image printing elements from liquid photopolymer resins.

SUMMARY OF THE INVENTION

It is an object of the present invention to provide improved methods of making flexographic printing plates from liquid photopolymers.

It is another object of the present invention to improve various steps of the plate making process to improve quality and consistency of the finished relief image printing plate.

It is still another object of the present invention to propose a process for making relief printing elements from liquid photopolymers without the need to remove uncured liquid photopolymer by washing the printing element in water or another solvent.

To that end, in one embodiment, the present invention relates generally to method of making a relief printing element in a liquid photopolymer platemaking process, wherein a layer of liquid photopolymer is applied over a coverfilm positioned on a negative on a glass platen and a backing sheet is applied over the liquid photopolymer layer, the method comprising the steps of:
  a) selectively exposing the layer of liquid photopolymer to actinic radiation through the negative to crosslink and cure portions of the layer of liquid photopolymer and create the relief image therein, wherein portions of the layer of liquid photopolymer are not crosslinked and are uncured; and
  b) reclaiming uncured portions of the layer of liquid photopolymer for reuse in the platemaking process, wherein the step of reclaiming uncured portions of the layer of liquid photopolymer comprises:
    (i) heating the relief printing element to decrease the viscosity of the uncured portions of the layer of liquid photopolymer; and
    (ii) removing uncured portions of the layer of liquid photopolymer from the relief printing element, Preferably the method is conducted without the need to remove the uncured portions of the layer of liquid photopolymer by washing the relief printing element with water or another solvent.

DETAILED DESCRIPTION OF THE PREFERRED EMBODIMENTS

The present invention relates generally to improvements in the reclamation step of a liquid photopolymer platemaking process.

More particularly, the present invention relates generally to a method of making a relief printing element in a liquid photopolymer platemaking process, wherein a layer of liquid photopolymer is applied over a coverfilm positioned on a negative on a glass platen and a backing sheet is applied over the liquid photopolymer layer, the method comprising the steps of:
  a) selectively exposing the layer of liquid photopolymer to actinic radiation through the negative to crosslink and cure portions of the layer of liquid photopolymer and create the relief image therein, wherein portions of the layer of liquid photopolymer are not crosslinked and are uncured; and
  b) reclaiming uncured portions of the layer of liquid photopolymer for reuse in the platemaking process, wherein the step of reclaiming uncured portions of the layer of liquid photopolymer comprises:
    i) heating the relief printing element to decrease the viscosity of the uncured portions of the layer of liquid photopolymer; and
    ii) removing uncured portions of the layer of liquid photopolymer from the relief printing element, Preferably the method is conducted without the need to remove the uncured portions of the layer of liquid photopolymer by washing the relief printing element with water or another solvent.

As described herein, a layer of liquid photopolymer is dispensed, cast or otherwise deposited on top of an exposure glass that has been covered with a photographic negative of a desired image and a coverfilm. The photopolymer may be any material which is both fluid when uncured and that hardens upon exposure to selective wavelengths of actinic radiation. Such photopolymerizable resins are very commonly used in the photopolymer printing plate making industry, and are thus well known to those skilled in that art. One or more different photopolymerizable resins or resin compositions may be employed.

Any liquid photopolymerizable resin that is a fluid when uncured and that hardens upon exposure to selective wavelengths of actinic radiation may be used in the practice of the present invention. Examples of liquid curable photopolymerizable resins include those described in U.S. Pat. No. 3,537,853 to Wessells et al., U.S. Pat. No. 3,794,494 to Kai et al., U.S. Pat. No. 3,960,572 to Ibata et al. and U.S. Pat. No. 4,442,302 to Pohl, the subject matter of each of which is herein incorporated by reference in its entirety. The liquid photopolymerizable resin may also include additives such as antioxidants, accelerators, dyes, inhibitors, activators, fillers, pigments, antistatic agents, flame-retardant agents, thickeners, thixotropic agents, surface active agents, light scattering agents, viscosity modifiers, extending oils, plasticizers, and detackifiers, by way of example and not limitation. These additives may be pre-blended with one or monomers or other compounds to be polymerized. Various fillers, including for example, natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, etc. may also be included in the photopolymer composition in amounts that will not interfere with or otherwise inhibit the photocuring reaction or other steps in the platemaking process.

The photocurable reaction may be initiated by actinic radiation, including for example, various types of UV lights.

Preferably, the coverfilm that is placed on the exposure glass is either a biaxially oriented polypropylene (BOPP) film, a polyester film, or a polyethylene terephthalate (PET) film and is preferably transparent to actinic radiation. To aid in removal, the coverfilm may be treated with a release agent such as a silicone release agent or other release agent known in the art. Also, in a preferred embodiment, a vacuum is drawn on the coverfilm in order to remove creases and hold it in place on the exposure glass. As described herein, the imagewise exposure to actinic radiation is from the frontside of the photopolymerizable layer and includes the image or film negative being placed on the coverfilm layer.

Substantially simultaneously with casting the photopolymerizable resin layer, a substrate is laminated on the photopolymerizable resin layer. This substrate may preferably comprise a material selected from the group consisting of polyester films, acrylic films, acrylonitrile-butadiene-styrene resins, phenolic resins, and combinations of one or more of the foregoing, given by way of example rather than limitation. This substrate should be transparent or translucent to actinic radiation. In addition, if desired, the substrate may be treated with a release layer as discussed above. If the substrate material diffracts the exposure radiation so as to impart the resolution of the image, collimated light may be used to overcome the diffraction.

If desired, a floor layer may be created in the resin layer after the substrate has been laminated to the liquid photopolymerizable resin layer. The floor layer may be created by exposing the photopolymerizable resin layer to actinic radiation through the substrate to create a cured and crosslinked thin floor layer over the entire area adjacent to the substrate.

Various means are known in the art for dispensing the liquid photopolymer layer onto the negative on the glass platen and for removing entrapped air or gases in the liquid photopolymer layer so that gas bubbles are not formed in the photopolymer layer that would adversely affect printing performance. In addition, as described in U.S. Pat. No. 3,597,080, a heating element may be provided to maintain the fluidity of the liquid photopolymer composition in the storage tank housing and prevent the liquid photopolymer composition from congealing on a doctor blade which is provided to remove excess composition from the glass platen.

It has surprisingly been found that the use of a heating element, in combination with an absorbent fabric that comes into contact with the imaged plate material, enhances material removal. The heating elements serves to reduce the viscosity of the remaining uncured liquid photopolymer material and enables greater absorption into the non-woven material. The enhancement is necessary to provide higher quality performance from the fully processed printing plate In a preferred embodiment, the printing element is heated to a temperature of between about 40 and about 220° C., more preferably to a temperature of between about 60 and about 150° C. to reduce the viscosity of the uncured liquid photopolymer. The temperature to which the printing element is heated will depend on the particular composition of the photopolymer used in the process.

In one embodiment, the printing element is heated to the desired temperature by means of an infrared heater arrangeable adjacent to the printing element to heat the printing element and reduce the viscosity of the uncured liquid photopolymer. Other types of heaters would also be known to those skilled in the art and would also be usable in the practice of the invention.

Once substantially all of the uncured liquid photopolymer has been removed from the printing element, the printing element can be blotted with a fabric to remove the remainder of the uncured liquid photopolymer. This removal may be sped up by blotting the unexposed area with a sponge or other absorbent material. Preferably the blotting occurs while the printing element is heated.

Thereafter, the printing element may be subjected to various post exposure and/or detackification steps. For example, the printing element may be submerged in a water and salt solution and subjected to an additional exposure to actinic radiation to strengthen the plate. A detackification step may also be performed in which a germicidal unit (light finisher) to ensure a tack-free plate surface.

Thus it can be seen that the reclamation of liquid photopolymer can be enhanced by heating the liquid, printing element during the reclamation step to reduce the viscosity of the uncured liquid photopolymer so that additional liquid photopolymer can be removed and recycled in the process.

It should also be understood that the following claims are intended to cover all of the generic and specific features of the invention described herein and all statements of the scope of the invention that as a matter of language might fall there between.

What is claimed is:

1. A method of making a relief printing element in a liquid photopolymer platemaking process, wherein a layer of liquid photopolymer is applied over a coverfilm positioned on a negative on a glass platen and a backing sheet is applied over the liquid photopolymer layer, the method comprising the steps of:
    a) selectively exposing the layer of liquid photopolymer to actinic radiation through the negative to crosslink and cure portions of the layer of liquid photopolymer and create a relief image therein, wherein portions of the layer of liquid photopolymer are not crosslinked and are uncured; and
    b) reclaiming uncured portions of the layer of liquid photopolymer for reuse in the platemaking process, wherein the step of reclaiming uncured portions of the layer of liquid photopolymer comprises:
        i) heating the relief printing element to decrease the viscosity of the uncured portions of the layer of liquid photopolymer; and
        ii) removing uncured portions of the layer of liquid photopolymer from the relief printing element;
    c) blotting the relief printing element to remove any uncured liquid photopolymer remaining on the relief printing element after step (b);
    wherein uncured portions of the layers of liquid photopolymer are removed without washing the relief printing element with water or another solvent.

2. The method according to claim 1, wherein the relief printing element is heated to a temperature of between about 40 and about 220° C.

3. The method according to claim 2, wherein the relief printing element is heated to a temperature of between about 60 and about 150° C.

4. A method of making a relief printing element in a liquid photopolymer platemaking process, wherein a layer of liquid photopolymer is applied over a coverfilm positioned on a negative on a glass platen and a backing sheet is applied over the liquid photopolymer layer, the method comprising the steps of:
    a) selectively exposing the layer of liquid photopolymer to actinic radiation through the negative to crosslink and cure portions of the layer of liquid photopolymer and create a relief image therein, wherein portions of the layer of liquid photopolymer are not crosslinked and are uncured; and
    b) reclaiming uncured portions of the layer of liquid photopolymer for reuse in the platemaking process, wherein the step of reclaiming uncured portions of the layer of liquid photopolymer comprises:

i) heating the relief printing element to decrease the viscosity of the uncured portions of the layer of liquid photopolymer; and ii) removing uncured portions of the layer of liquid photopolymer from the relief printing element;

wherein uncured portions of the layers of liquid photopolymer are removed without washing the relief printing element with water or another solvent; and thereafter subjecting the relief printing element to a post exposure step and drying the relief printing element after the post exposure step.

5. The method according to claim 4, wherein the post exposure step comprises submerging the relief printing element in a water and salt solution.

6. The method according to claim 5, wherein the post exposure step comprises performing an additional exposure of the relief printing element to actinic radiation.

7. The method according to claim 4, wherein the relief printing element is heated to a temperature of between about 40 and about 220° C.

8. The method according to claim 7, wherein the relief printing element is heated to a temperature of between about 60 and about 150° C.

9. The method according to claim 4, further comprising a step of blotting the relief printing element to remove any uncured liquid photopolymer remaining on the relief printing element after the reclamation step.

10. A method of making a relief printing element in a liquid photopolymer platemaking process, wherein a layer of liquid photopolymer is applied over a coverfilm positioned on a negative on a glass platen and a backing sheet is applied over the liquid photopolymer layer, the method comprising the steps of:

a) selectively exposing the layer of liquid photopolymer to actinic radiation through the negative to crosslink and cure portions of the layer of liquid photopolymer and create a relief image therein, wherein portions of the layer of liquid photopolymer are not crosslinked and are uncured; and b) reclaiming uncured portions of the layer of liquid photopolymer for reuse in the platemaking process, wherein the step of reclaiming uncured portions of the layer of liquid photopolymer comprises:

i) heating the relief printing element to decrease the viscosity of the uncured portions of the layer of liquid photopolymer; and ii) removing uncured portions of the layer of liquid photopolymer from the relief printing element;

wherein uncured portions of the layers of liquid photopolymer are removed without washing the relief printing element with water or another solvent; and thereafter subjecting the relief printing element to a post exposure step and a detackification step.

11. The method according to claim 10, wherein the relief printing element is heated to a temperature of between about 40 and about 220° C.

12. The method according to claim 11, wherein the relief printing element is heated to a temperature of between about 60 and 150° C.

13. The method according to claim 10, further comprising a step of blotting the relief printing element to remove any uncured liquid photopolymer remaining on the relief printing element after the reclamation step.

\* \* \* \* \*